(12) United States Patent
Yi et al.

(10) Patent No.: US 9,917,027 B2
(45) Date of Patent: Mar. 13, 2018

(54) INTEGRATED CIRCUITS WITH ALUMINUM VIA STRUCTURES AND METHODS FOR FABRICATING THE SAME

(71) Applicant: Globalfoundries Singapore Pte. Ltd., Singapore (SG)

(72) Inventors: Wanbing Yi, Singapore (SG); Mahesh Bhatkar, Singapore (SG); Chin Chuan Neo, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 69 days.

(21) Appl. No.: 14/985,256

(22) Filed: Dec. 30, 2015

(65) Prior Publication Data

US 2017/0194229 A1  Jul. 6, 2017

(51) Int. Cl.
| | |
|---|---|
| *H01L 21/28* | (2006.01) |
| *H01L 21/311* | (2006.01) |
| *H01L 21/768* | (2006.01) |
| *H01L 23/528* | (2006.01) |
| *H01L 23/31* | (2006.01) |
| *H01L 23/532* | (2006.01) |
| *H01L 21/56* | (2006.01) |
| *H01L 23/29* | (2006.01) |

(52) U.S. Cl.
CPC ......... *H01L 23/3192* (2013.01); *H01L 21/56* (2013.01); *H01L 21/76816* (2013.01); *H01L 21/76877* (2013.01); *H01L 23/291* (2013.01); *H01L 23/528* (2013.01); *H01L 23/53214* (2013.01); *H01L 23/53228* (2013.01)

(58) Field of Classification Search
CPC ............... H01L 23/53214–23/53223; H01L 23/528–23/5283; H01L 21/76816; H01L 21/76877; H01L 21/76879; H01L 21/76885; H01L 23/4855; H01L 21/30604–21/30608; H01L 21/3065–21/30655; H01L 21/31056; H01L 21/76897; H01L 2221/1005–2221/1015; H01L 2221/1036; H01L 2224/05006; H01L 2224/05546
See application file for complete search history.

(56) References Cited

U.S. PATENT DOCUMENTS

| | | | | |
|---|---|---|---|---|
| 4,674,174 A | * | 6/1987 | Kishita | H01L 21/0272 257/280 |
| 4,809,055 A | * | 2/1989 | Ishibashi | H01L 23/4855 257/283 |
| 4,814,041 A | * | 3/1989 | Auda | H01L 21/31116 257/E21.252 |

(Continued)

*Primary Examiner* — Maliheh Malek
(74) *Attorney, Agent, or Firm* — Lorenz & Kopf, LLP

(57) ABSTRACT

A method for fabricating an integrated circuit includes forming a first opening in an upper dielectric layer, the first opening having a first width, forming a second opening in a lower dielectric layer, the lower dielectric layer being below the upper dielectric layer, the second opening having a second width that is narrower than the first width, the second opening being substantially centered underneath the first opening so as to form a stepped via structure, conformally depositing an aluminum material layer in the stepped via structure and over the upper dielectric layer, and forming a passivation layer over the aluminum material layer.

14 Claims, 6 Drawing Sheets

(56) References Cited

U.S. PATENT DOCUMENTS

| | | | | |
|---|---|---|---|---|
| 5,068,707 A * | 11/1991 | Pors | H01L 27/10805 | 257/311 |
| 5,203,957 A * | 4/1993 | Yoo | H01L 21/31116 | 204/192.32 |
| 5,354,386 A * | 10/1994 | Cheung | H01L 21/31116 | 148/33.3 |
| 5,453,403 A * | 9/1995 | Meng | H01L 21/76804 | 257/E21.578 |
| 5,578,523 A * | 11/1996 | Fiordalice | H01L 21/76802 | 257/E21.576 |
| 5,591,675 A * | 1/1997 | Kim | H01L 21/76804 | 148/DIG. 161 |
| 5,663,091 A * | 9/1997 | Yen | H01L 23/5252 | 257/E23.147 |
| 5,940,732 A * | 8/1999 | Zhang | H01L 21/31111 | 257/E21.251 |
| 6,037,213 A * | 3/2000 | Shih | H01L 27/10817 | 257/E21.648 |
| 6,040,243 A * | 3/2000 | Li | H01L 21/76805 | 257/E21.579 |
| 6,103,456 A * | 8/2000 | Tobben | H01L 21/76807 | 257/E21.029 |
| 6,130,161 A * | 10/2000 | Ashley | H01L 21/76846 | 257/751 |
| 6,143,649 A * | 11/2000 | Tang | H01L 21/76804 | 257/750 |
| 6,153,528 A * | 11/2000 | Lan | H01L 21/7681 | 257/E21.579 |
| 6,211,090 B1 * | 4/2001 | Durlam | B82Y 10/00 | 216/22 |
| 6,274,457 B1 * | 8/2001 | Sakai | H01L 21/76232 | 257/506 |
| 6,380,096 B2 * | 4/2002 | Hung | H01L 21/02063 | 216/39 |
| 6,410,437 B1 * | 6/2002 | Flanner | H01L 21/31116 | 257/E21.252 |
| 6,429,480 B1 * | 8/2002 | Koishikawa | H01L 27/105 | 257/317 |
| 6,475,929 B1 * | 11/2002 | Gabriel | H01L 21/7681 | 257/E21.576 |
| 6,495,470 B2 * | 12/2002 | Sadjadi | H01L 21/76804 | 257/E21.578 |
| 6,514,844 B1 * | 2/2003 | Martin | H01L 21/31155 | 257/E21.248 |
| 6,605,540 B2 * | 8/2003 | Ali | H01L 21/0276 | 216/72 |
| 6,774,032 B1 * | 8/2004 | Park | H01L 21/76804 | 257/E21.577 |
| 6,787,458 B1 * | 9/2004 | Tripsas | H01L 27/285 | 438/618 |
| 6,831,323 B2 * | 12/2004 | Ito | H01L 27/11502 | 257/306 |
| 6,861,347 B2 * | 3/2005 | Lee | H01L 21/76808 | 257/E21.579 |
| 7,081,408 B2 * | 7/2006 | Lane | H01L 21/3085 | 257/774 |
| 7,238,609 B2 * | 7/2007 | Ito | H01L 21/76804 | 257/E21.018 |
| 7,323,418 B1 * | 1/2008 | Ngo | G11C 13/0014 | 438/708 |
| 7,514,362 B2 * | 4/2009 | Pinnow | H01L 21/0332 | 438/640 |
| 7,545,041 B2 * | 6/2009 | Allen | H01L 21/0276 | 257/751 |
| 8,835,303 B2 * | 9/2014 | Feustel | H01L 21/76804 | 257/E21.579 |
| 9,159,556 B2 | 10/2015 | Johnson | | |
| 9,412,660 B1 * | 8/2016 | Xie | H01L 21/76897 | |
| 9,607,883 B2 * | 3/2017 | Chiu | H01L 21/76802 | |
| 9,613,880 B2 * | 4/2017 | Zhang | H01L 23/3171 | |
| 9,698,102 B2 * | 7/2017 | Ko | H01L 24/05 | |
| 2001/0054731 A1 * | 12/2001 | Takahashi | H01L 23/5283 | 257/306 |
| 2002/0111009 A1 * | 8/2002 | Huang | H01L 24/03 | 438/613 |
| 2004/0026785 A1 * | 2/2004 | Tomita | H01L 23/3171 | 257/758 |
| 2004/0048468 A1 * | 3/2004 | Liu | H01L 21/76805 | 438/687 |
| 2004/0080024 A1 * | 4/2004 | Datta | H01L 24/03 | 257/627 |
| 2006/0148245 A1 * | 7/2006 | Kim | H01L 21/76804 | 438/640 |
| 2006/0177630 A1 * | 8/2006 | Lee | H01L 21/7684 | 428/123 |
| 2006/0192289 A1 * | 8/2006 | Drexl | H01L 23/53228 | 257/758 |
| 2007/0034517 A1 * | 2/2007 | Tsao | C25D 5/10 | 205/118 |
| 2007/0099368 A1 * | 5/2007 | Ahn | H01L 29/42316 | 438/199 |
| 2007/0224835 A1 * | 9/2007 | Iriguchi | H01L 21/0274 | 438/761 |
| 2008/0194095 A1 * | 8/2008 | Daubenspeck | H01L 23/3192 | 438/612 |
| 2009/0085172 A1 * | 4/2009 | Horigome | C23C 16/347 | 257/632 |
| 2010/0167531 A1 * | 7/2010 | Park | H01L 21/76807 | 438/653 |
| 2011/0304049 A1 * | 12/2011 | Shigihara | H01L 23/53238 | 257/762 |
| 2012/0018831 A1 * | 1/2012 | Kim | H01L 27/14629 | 257/432 |
| 2012/0043663 A1 * | 2/2012 | Ko | H01L 21/823475 | 257/773 |
| 2012/0049343 A1 | 3/2012 | Schulze et al. | | |
| 2013/0005147 A1 * | 1/2013 | Angyal | H01L 21/31116 | 438/692 |
| 2013/0082231 A1 * | 4/2013 | Tada | G11C 13/0007 | 257/4 |
| 2013/0221528 A1 * | 8/2013 | Cheng | H01L 23/53238 | 257/751 |
| 2014/0138835 A1 * | 5/2014 | Zhao | H01L 23/53238 | 257/758 |
| 2015/0035021 A1 * | 2/2015 | Liu | H01L 29/78 | 257/288 |
| 2015/0170963 A1 * | 6/2015 | Ishizaka | H01L 21/76843 | 438/643 |
| 2015/0200158 A1 * | 7/2015 | Okumura | H01L 23/5226 | 257/368 |
| 2015/0228595 A1 * | 8/2015 | Willeke | H01L 21/32139 | 438/614 |
| 2015/0249036 A1 * | 9/2015 | Cai | H01L 27/088 | 257/382 |
| 2015/0255330 A1 * | 9/2015 | Lee | H01L 21/76843 | 438/653 |
| 2015/0262873 A1 * | 9/2015 | Chu | H01L 23/5226 | 257/773 |
| 2015/0311251 A1 * | 10/2015 | Yi | H01L 27/222 | 257/421 |
| 2015/0325469 A1 * | 11/2015 | Chiu | H01L 21/76877 | 438/653 |
| 2016/0079115 A1 * | 3/2016 | Lee | H01L 21/76804 | 438/637 |
| 2016/0118355 A1 * | 4/2016 | Lin | H01L 23/3192 | 257/773 |
| 2016/0126183 A1 * | 5/2016 | Chen | H01L 23/5226 | 257/774 |
| 2016/0133830 A1 * | 5/2016 | Tan | H01L 43/12 | 257/421 |
| 2016/0163666 A1 * | 6/2016 | Yajima | H01L 24/08 | 257/773 |
| 2016/0268336 A1 * | 9/2016 | Shum | H01L 43/12 | |
| 2016/0343910 A1 * | 11/2016 | Huang | H01L 27/15 | |
| 2016/0351792 A1 * | 12/2016 | Jiang | H01L 43/02 | |
| 2016/0358817 A1 * | 12/2016 | Yang | H01L 21/76843 | |
| 2017/0104029 A1 * | 4/2017 | Li | H01L 27/228 | |

(56) References Cited

U.S. PATENT DOCUMENTS

| | | | |
|---|---|---|---|
| 2017/0125353 A1* | 5/2017 | Chen | H01L 23/53238 |
| 2017/0162501 A1* | 6/2017 | Yi | H01L 23/5226 |
| 2017/0179020 A1* | 6/2017 | Chang | H01L 21/0217 |
| 2017/0250243 A1* | 8/2017 | Lee | H01L 28/60 |
| 2017/0263559 A1* | 9/2017 | Ko | H01L 21/823475 |

* cited by examiner

US 9,917,027 B2

INTEGRATED CIRCUITS WITH ALUMINUM VIA STRUCTURES AND METHODS FOR FABRICATING THE SAME

TECHNICAL FIELD

The present disclosure generally relates to the design and fabrication of integrated circuits. More particularly, the present disclosure relates to integrated circuits with aluminum via structures and methods for fabricating the same.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through an underlying channel between the source and drain regions.

After the various MOS transistors have been fabricated, they may be interconnected to form the desired electrical circuits. This interconnections occurs in a series of wafer processing steps collectively referred to as back-end-of-line (BEOL) processing. BEOL processing involves creating metal interconnect wires, formed of copper, for example, that are isolated by dielectric layers, such as silicon dioxide or other low-k insulator material. The various metal layers are interconnected by etching holes (called "vias") in the insulating material and then depositing another metal material, such as aluminum, within the vias. After the formation of the interconnect wires and vias, one or more dielectric passivation layers may be formed over the integrated circuit. Passivation layers are provided to protect the interconnections from external environmental conditions and to help control the electrical properties of the outer semiconductors layers (such as the outer interconnection layers).

FIG. 1 illustrates a particular problem that has been encountered in the prior art when depositing passivation layers over aluminum-filled vias. As shown in FIG. 1, which illustrates a portion 100 of an integrated circuit structure, an outer copper interconnect wire 110 is formed within a first dielectric layer 102 formed of, for example, silicon dioxide. Second dielectric layer 104 formed of, for example, silicon nitride, and a third dielectric layer 106 formed of, for example, silicon dioxide, are provided overlying the first dielectric layer 102. A via 130 (the vertical and lateral dimensions of which are shown by intersecting arrows) is formed within or through the second and third dielectric layers 104, 106, and over the interconnect wire 110. An aluminum layer 120 is deposited to fill the via 130. As aluminum is typically deposited by conformal means, a gap or void 135 forms in the aluminum layer 120 directly over the via 130, due to the difference in elevation of the bottom of the via 130 (i.e., top of the interconnect wire 110) and the top of the third dielectric layer 106.

When passivation of the aluminum layer 120 is thereafter attempted (using a first passivation layer 122 formed of, for example, silicon dioxide and a second passivation 124 layer overlying the first passivation layer 122 formed of, for example, silicon nitride), relatively poor passivation (i.e., inadequate passivation layer thickness) of the aluminum layer 120 within the gap or void 135 along sidewall edges 150 thereof has been observed, due to the relatively steep angle of incline of such sidewall edges 150. This phenomenon results from a progressively narrowing opening 140 at the top of the gap or void 135 as the passivation layers 122, 124 are deposited. Such poor passivation can lead to device failures as a result of possible exposure to the aforementioned environmental conditions, as well as due to loss of control of the electrical properties of the outer semiconductor layers (such as aluminum layer 120).

Accordingly, it is desirable to provide integrated circuits and methods for fabricating integrated circuits that achieve improved resistance to environmental harms, as well as better control of electrical properties. In this regard, it is desirable to provide integrated circuits and methods for fabricating integrated circuits that avoid the problem of inadequate passivation of aluminum layers formed over vias. Additionally, it is desirable to provide methods for the fabrication of such integrated circuits that are easily integrated into existing process flow schemes used in semiconductor fabrication facilities. Furthermore, other desirable features and characteristics of the present disclosure will become apparent from the subsequent detailed description and the appended claims, taken in conjunction with the accompanying drawings and the foregoing technical field and background.

BRIEF SUMMARY

Accordingly, the present disclosure generally relates to integrated circuits and methods for fabricating integrated circuits including an aluminum via structure. In one embodiment, a method for fabricating an integrated circuit includes forming a first opening in an upper dielectric layer, the first opening having a first width, forming a second opening in a lower dielectric layer, the lower dielectric layer being below the upper dielectric layer, the second opening having a second width that is narrower than the first width, the second opening being substantially centered underneath the first opening so as to form a stepped via structure, conformally depositing an aluminum material layer in the stepped via structure and over the upper dielectric layer, and forming a passivation layer over the aluminum material layer.

In another embodiment, a method for fabricating an integrated circuit that includes a stepped via structure including providing or obtaining an integrated circuit structure including a metal interconnect wire, a lower dielectric layer disposed over and in contact with the metal interconnect wire, and an upper dielectric layer disposed over and in contact with the lower dielectric layer, forming a first opening in the upper dielectric layer, the first opening being substantially centered over the metal interconnect wire and having a width that is substantially identical to a width of the metal interconnect wire, wherein the first opening extends to a depth within the upper dielectric layer that is less than a total thickness of the upper dielectric layer, but greater than half of the total thickness of the upper dielectric layer, and forming a sub-opening in the upper dielectric layer, the sub-opening being disposed below the first opening and centered with respect to the first opening, wherein the sub-opening has a width that is narrower than the width of the first opening, and wherein the sub-opening extends through the upper dielectric layer to expose an upper surface of the lower dielectric layer. The method further includes simultaneously with forming the sub-opening, widening the first opening so as to form a widened first opening and extending the depth of the widened first opening so as to extend through an entirety of the thickness of the upper dielectric layer, thereby forming an extended, widened first opening that is disposed entirely within the upper dielectric layer. Still further, the method includes simultaneously with extending the depth of the widened first opening, extending a depth of the sub-opening so as to extend through an entirety of the lower dielectric layer and expose an upper surface of the interconnect wire, thereby forming an extended sub-opening that is disposed entirely within the lower dielectric layer, wherein the extended, widened first opening and the extended sub-opening include the stepped via structure. Further, the method includes conformally depositing an aluminum material layer in the stepped via structure, in contact with the interconnect wire, and over the upper dielectric layer, wherein conformally depositing the aluminum material layer includes forming aluminum layer sidewalls over the stepped via structure and forming a passivation layer over the aluminum material layer, wherein forming the passivation layer includes forming the passivation layer along the aluminum layer sidewalls.

In yet another embodiment, a method for fabricating an integrated circuit that includes a stepped via structure includes providing or obtaining an integrated circuit structure including a metal interconnect wire, a lower dielectric layer disposed over and in contact with the metal interconnect wire, and an upper dielectric layer disposed over and in contact with the lower dielectric layer, forming a first opening in the upper dielectric layer, the first opening being substantially centered over the metal interconnect wire and having a width that is substantially identical to a width of the metal interconnect wire, wherein the first opening extends to a depth within the upper dielectric layer that is less than half of a total thickness of the upper dielectric layer, and forming a sub-opening in the upper dielectric layer, the sub-opening being disposed below the first opening and centered with respect to the first opening, wherein the sub-opening has a width that is narrower than the width of the first opening, and wherein the sub-opening extends through the upper dielectric layer to expose an upper surface of the lower dielectric layer. The method further includes simultaneously with forming the sub-opening, widening the first opening so as to form a widened first opening and extending the depth of the widened first opening so as to extend further, but not entirely through the thickness of the upper dielectric layer, thereby forming an extended, widened first opening that is disposed entirely within the upper dielectric layer. Still further, the method includes simultaneously with extending the depth of the widened first opening, extending a depth of the sub-opening so as to extend through an entirety of the lower dielectric layer and expose an upper surface of the interconnect wire, thereby forming an extended sub-opening that is disposed partially within the lower dielectric layer and partially within the upper dielectric layer, wherein the extended, widened first opening and the extended sub-opening include the stepped via structure. Further, the method includes conformally depositing an aluminum material layer in the stepped via structure, in contact with the interconnect wire, and over the upper dielectric layer, wherein conformally depositing the aluminum material layer includes forming aluminum layer sidewalls over the stepped via structure and forming a passivation layer over the aluminum material layer, wherein forming the passivation layer includes forming the passivation layer along the aluminum layer sidewalls.

This brief summary is provided to introduce a selection of concepts in a simplified form that are further described below in the detailed description. This brief summary is not intended to identify key features or essential features of the claimed subject matter, nor is it intended to be used as an aid in determining the scope of the claimed subject matter

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Figure 8:
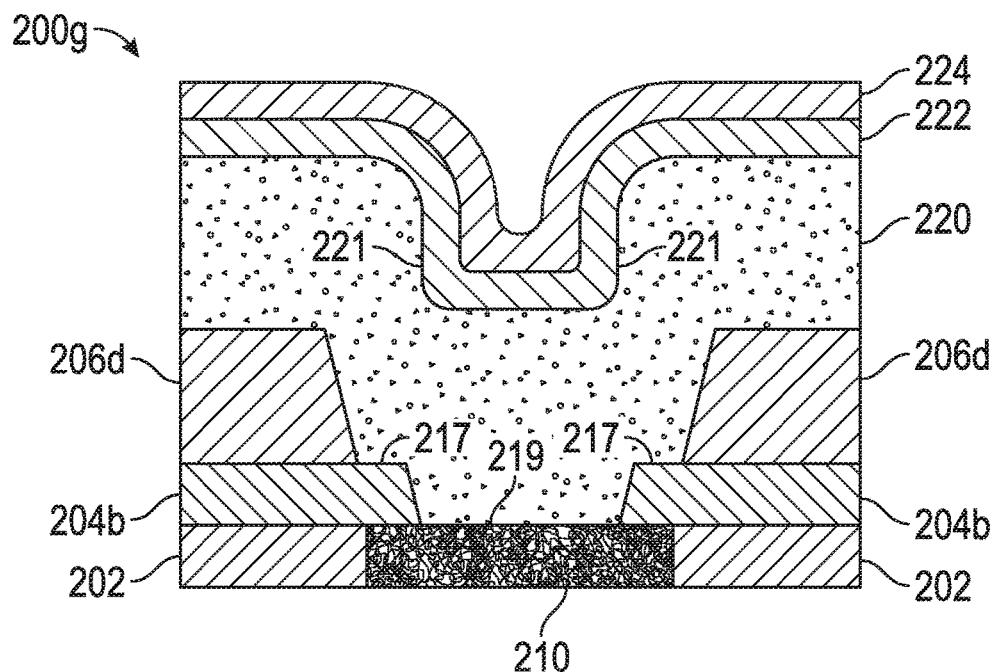
Figure 15:
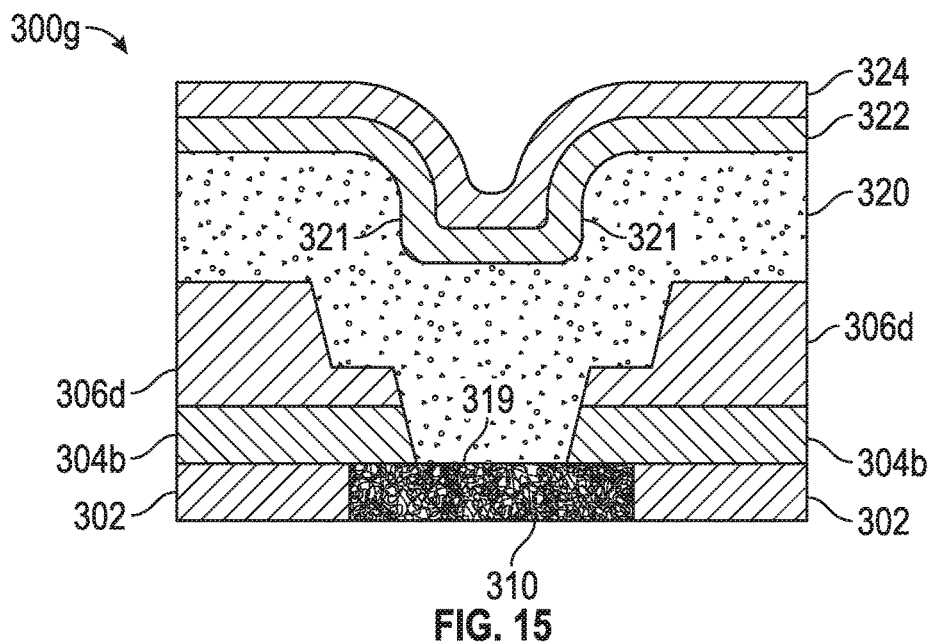

Embodiments of the present disclosure are generally directed toward integrated circuit structures and methods for fabricating the same that include improved via configurations that are provided to prevent the problems of inadequate or poor passivation of an overlying aluminum layer. As shown in FIGS. 8 and 15, and as will be described in greater detail below, various embodiments of a "stepped" via configuration are provided. When an aluminum layer is deposited into this stepped via structure using conformal deposition means, the side walls of the resulting gap or void in the aluminum layer formed over the via retain a sufficiently shallow angle of incline that a subsequent passivation layer (or layers) deposited thereover is able to achieve good passivation coverage, even within the gap or void.

For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 2:
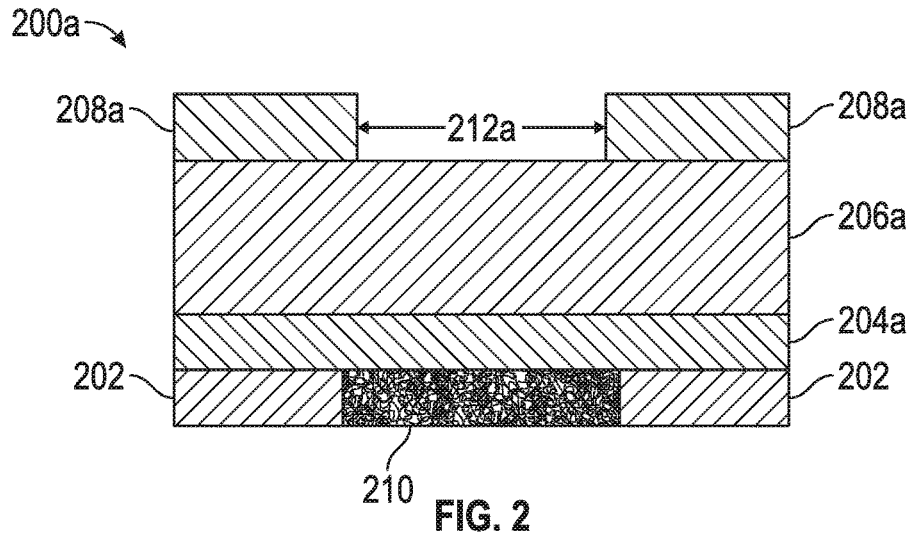
FIGS. 2-8 illustrate, in cross-section, integrated circuit structures and methods for fabricating integrated circuit structures including an aluminum via in accordance with some embodiments of the present disclosure.

FIGS. 2-8 illustrate, in cross-section, integrated circuit structures and methods for fabricating integrated circuit structures including an aluminum via in accordance with some embodiments of the present disclosure. In particular, FIG. 2 illustrates an integrated circuit structure 200*a* undergoing BEOL processing. In this regard, the skilled artisan will appreciate that during prior front end of line and/or middle of line processing, on or more active integrated circuit structures may have been formed on an underlying (non-illustrated) semiconductor substrate. Briefly, the semiconductor substrate is defined to mean any construction formed of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate may further include a plurality of isolation features, such as shallow trench isolation (STI) features or local oxidation of silicon (LOCOS) features. The isolation features may define and isolate the various microelectronic elements (not shown), also referred to herein as active integrated circuit structures. Examples of the various microelectronic elements that may be formed in the substrate include transistors (e.g., metal oxide semiconductor field effect transistors (MOSFET), complementary metal oxide semiconductor (CMOS) transistors, bipolar junction transistors (BJT), high voltage transistors, high frequency transistors, etc.); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

Integrated circuit structure 200a illustrates that portion of the integrated circuit located above the microelectronic elements, and including one or more of the interconnect wires, vias, and passivation layers formed during BEOL processing to complete the fabrication of the integrated circuit. In particular, structure 200a includes a first or "interconnect layer" dielectric layer 202. Interconnect layer dielectric layer 202 may be formed of silicon dioxide, silicate glass, or any other suitable low-k dielectric material. Interconnect layer dielectric layer 202 is provided for the purpose of electrically insulating one or more (non-illustrated) underlying interconnection layers or microelectronic element layers, and may be formed using any conventional deposition techniques, such as chemical vapor deposition (CVD), electro-chemical plating (ECP), and the like. Formed within interconnect layer dielectric layer 202 is a metal interconnect wire 210 that provides an electrical connection with one or more other wires or microelectronic elements. Metal interconnect wire may be formed of copper or other conductive metal, and it may be fabricated using conventional damascene or etch-back processes.

Overlying and in contact with interconnect layer dielectric layer 202 and metal interconnection wire 210 is second or lower dielectric layer 204a. Lower dielectric layer 204a may be formed of silicon nitride or any other suitable low-k dielectric material, and it may be provided using any conventional deposition process. Overlying and in contact with lower dielectric layer 204a is a third or upper dielectric layer 206a. Upper dielectric layer 206a may be formed of silicon dioxide, silicate glass, or any other suitable low-k dielectric material, and it may be provided using any convention deposition process.

Further illustrated in FIG. 2 is a patterned photoresist material layer 208a, which is formed over and in contact with upper dielectric layer 206a. Patterned photoresist material layer 208a includes opening 212a. Opening 212a may be formed in photoresist material layer 208a by exposing such layer to a radiation source (such as visible or ultraviolet light) through a patterned mask, and removing the exposed areas, using conventional photolithography processes. Opening 212a may be substantially centered overlying the metal interconnection wire 210. Further, opening 212a and metal interconnection wire 210 may have substantially identical widths across the integrated circuit. Thus, the method step described with regard to FIG. 2 may be characterized as providing or obtaining an integrated circuit structure 200a including a metal interconnect wire 210, a lower dielectric layer 204a disposed over and in contact with the metal interconnect wire 210, and an upper dielectric layer 206a disposed over and in contact with the lower dielectric layer 204a.

Figure 3:
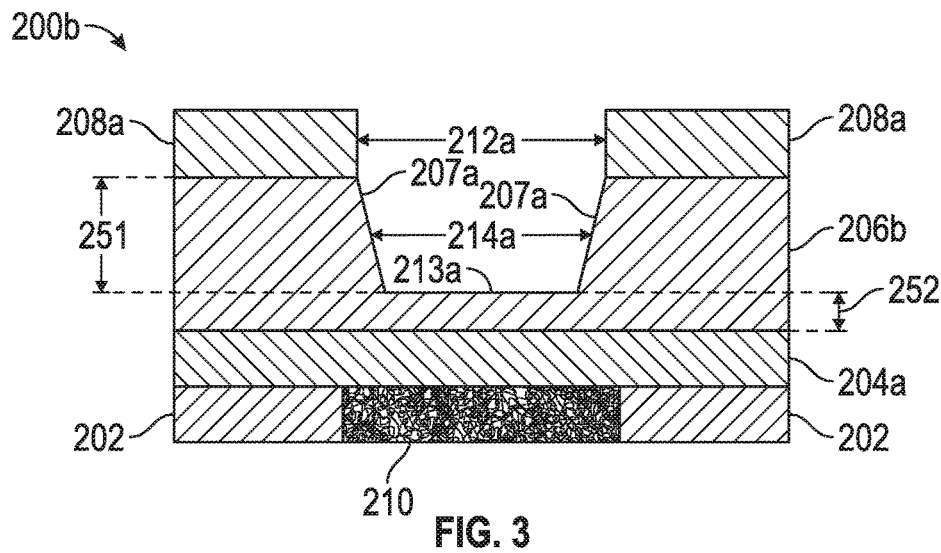

Turning now to FIG. 3, which illustrates integrated circuit structure 200b (a further advanced stage of BEOL fabrication from structure 200a), the patterned photoresist material layer 208a is used as an etch mask to etch the underlying upper dielectric layer 206a. The etched upper dielectric layer, which as a result of etching includes opening 214a, will now be referred to as upper dielectric layer 206b. The etching may be performed on the basis of any suitable wet or dry etching technique, and may be performed in an anisotropic manner such that etching of the upper dielectric layer 206b occurs substantially within the width defined by opening 212a of the patterned photoresist material layer 208a. Opening 214a within the etched upper dielectric layer 206b includes sidewalls 207a and bottom surface 213a. Due to the nature of etching, the sidewalls 207a may be slightly inclined, i.e., non-vertical, resulting in a width of bottom surface 213a that is slightly less than the width of opening 212a. It should be understood from FIG. 3 that the anisotropic etching process used to form opening 214a is performed only for a period of time sufficient to etch part-way through (e.g., greater than half-way) the upper dielectric layer 206b. That is, etching is performed such that opening 214a has a vertical depth 251 within upper dielectric layer 206b, and such that bottom surface 213a remains a vertical distance 252 above the lower dielectric layer 204a. The ratio of vertical depth 251 to vertical distance 252 may be from about 5:1 to about 1.5:1, such as about 4:1 to about 2:1. Thus, the method step described with regard to FIG. 3 may be characterized as forming a first opening 214a in the upper dielectric layer 206b, the first opening 214a being substantially centered over the metal interconnect wire 210 and having a width that is substantially identical to a width of the metal interconnect wire 210, wherein the first opening 214a extends to a depth 251 within the upper dielectric layer 206b that is less than a total thickness of the upper dielectric layer 206b, but greater than half of the total thickness of the upper dielectric layer 206b.

Figure 4:
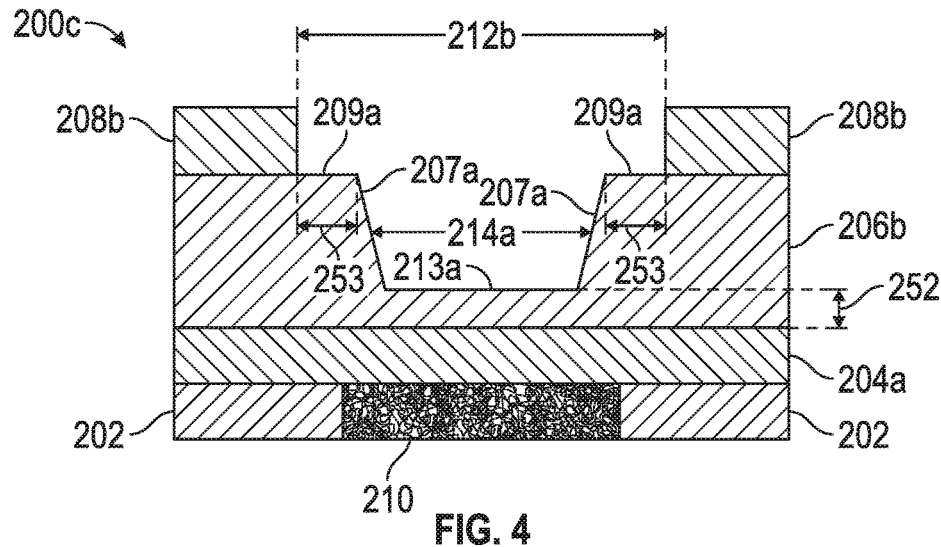

Turning now to FIG. 4, which illustrates integrated circuit structure 200c (a further advanced stage of BEOL fabrication from structure 200b), a resist trimming procedure is employed to widen the opening 212a in the patterned photoresist material layer 208a. Accordingly, the trimmed photoresist material layer will now be referred to as trimmed photoresist material layer 208b. Moreover, the widened opening will now be referred to as opening 212b. Photoresist trimming, as is known in the art, may be accomplished by exposure of the photoresist material to any conventional plasma or etchant that is suitably selective to the photoresist material. Because the photoresist material layer 208b is trimmed, without an etching of the underlying upper dielectric layer 206b, upper surfaces 209a of the upper dielectric layer 206b are exposed. The width 253 of each upper surface 209a is about half of the total increase in width of opening 212b. It should be appreciated that as shown in FIG. 4, opening 214a has not changed in dimensions from FIG. 3.

Figure 5:
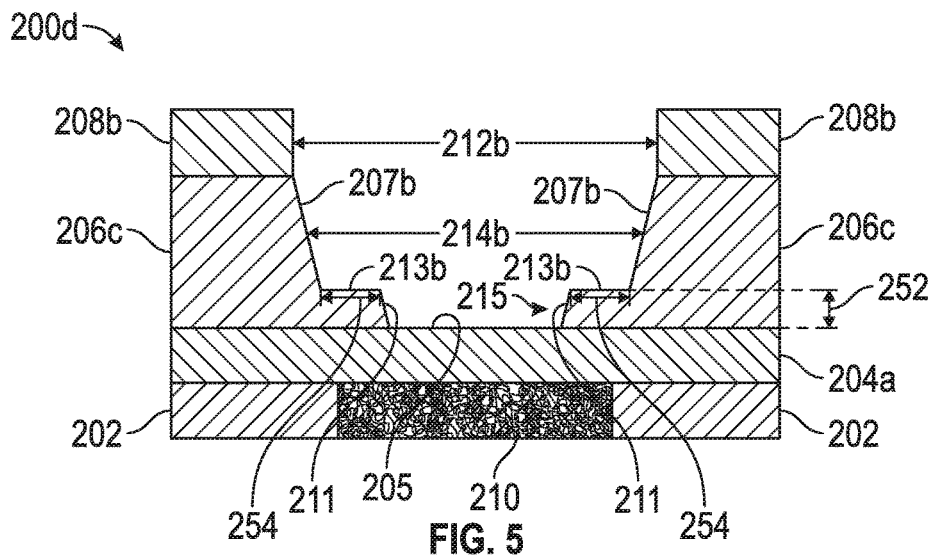

With reference now to FIG. 5, which illustrates integrated circuit structure 200d (a further advanced stage of BEOL fabrication from structure 200c), a further etching procedure is performed to increase the width of opening 214a commensurate in size with opening 212b. The trimmed photoresist material layer 208b is used as an etch mask to etch the underlying upper dielectric layer 206b. The etched upper dielectric layer, which as a result of etching now includes larger opening 214b, will now be referred to as upper dielectric layer 206c. The etching may be performed on the basis of any suitable wet or dry etching technique, and may be performed in an isotropic manner such that etching of the upper dielectric layer 206c occurs to both increase the distance between opening 214b sidewalls (now referred to as sidewalls 207b), but also to etch the bottom surface 213a so as to expose an upper surface 205 of the lower dielectric layer 204a, thereby forming a sub-opening 215 within upper dielectric layer 206c, in the area defined by vertical distance 252, upper surface 205, and sidewalls 211. Sub-opening 215 may be centered over the interconnect wire 210, and also centered underneath the opening 214b. Sub-opening 215 therefore has a width that is less/narrower (i.e., two times width 254 less) than opening 214b. Opening 214b within the etched upper dielectric layer 206c includes sidewalls 207b and bottom surfaces 213b. Due to the nature of the etching, the bottom surfaces 213b of the opening 214b have a width 254 that is substantially similar to the width 253 of the upper surfaces 209a. Thus, the method step described with regard to FIGS. 4 and 5 may be characterized as forming a sub-opening 215 in the upper dielectric layer 206c, the sub-opening 215 being disposed below the first opening 214b and centered with respect to the first opening 214a, wherein the sub-opening 215 has a width that is narrower than the width of the first opening 214a, and wherein the sub-opening 215 extends through the upper dielectric layer 206c to expose an upper surface 205 of the lower dielectric layer 204a. This method step may also be characterized as disclosing simultaneously with forming the sub-opening 215, widening the first opening 214a so as to form a widened first opening 214b.

Figure 6:
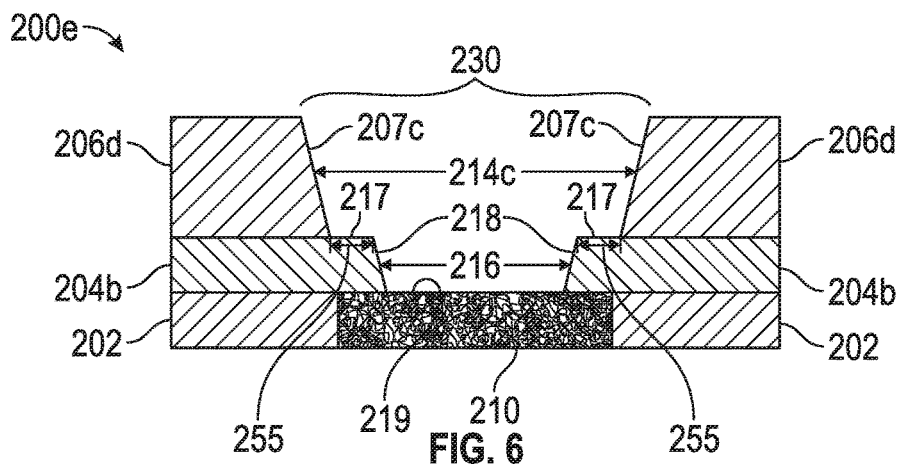

Turning now to FIG. 6, which illustrates integrated circuit structure 200e (a further advanced stage of BEOL fabrication from structure 200d), a further etching procedure is performed to increase the depth of sub-opening 215 into the underlying lower dielectric layer (so as to expose an upper surface 219 of the interconnect wire 210), which will now be referred to as lower dielectric layer 204b. The etching may be performed on the basis of any suitable wet or dry etching technique, and may be performed in an anisotropic manner such that both the depth of the opening 214b (hereafter referred to as opening 214c) and the sub-opening 215 (hereafter referred to as sub-opening 216) are increased. In this manner, the bottom surfaces of opening 214c are now formed by upper surfaces 217 of the lower dielectric layer 204b, and have a width 255 that is substantially the same as width 254. Sidewalls of the opening 214c are thereby extended in length, and are now referred to as sidewalls 207c; and consequently, the further etched upper dielectric layer is now referred to as upper dielectric layer 206d. Moreover, the bottom surface of the sub-opening 216 is now formed by the interconnect wire 210 (i.e., upper surface 219). As the etching is anisotropic, the width of opening 214c remains substantially unchanged as compared to FIG. 5, and the width of sub-opening 216 remains substantially unchanged as compared to FIG. 5. Photoresist material layer 208b is also fully removed in this etching process. Accordingly, FIG. 6 illustrates a via structure 230 that includes opening 214c and sub-opening 216. More particularly, via structure 230 is defined by an upper surface 219 of interconnection line 210, sidewalls 218 of the lower dielectric layer 204b, exposed upper surfaces 217 of the lower dielectric layer 204b, and sidewalls 207c of upper dielectric layer 206d. It should also be appreciated that the sidewalls 218 of the lower dielectric layer 204b and the exposed upper surfaces 217 of the lower dielectric layer 204b form a "step-like" structure, and thus via structure 230 may be referred to as a stepped via structure. Thus, the method step described with regard to FIG. 6 may be characterized as extending the depth of the widened first opening 214b so as to extend through an entirety of the thickness of the upper dielectric layer 206d, thereby forming an extended, widened first opening 214c that is disposed entirely within the upper dielectric layer 206d. The method step may also be characterized as disclosing simultaneously with extending the depth of the widened first opening 214b, extending a depth of the sub-opening 215 so as to extend through an entirety of the lower dielectric layer 204b and expose an upper surface 219 of the interconnect wire 210, thereby forming an extended sub-opening 216 that is disposed entirely within the lower dielectric layer 204b, wherein the extended, widened first opening 214c and the extended sub-opening 216 include the stepped via structure 230.

Figure 7:
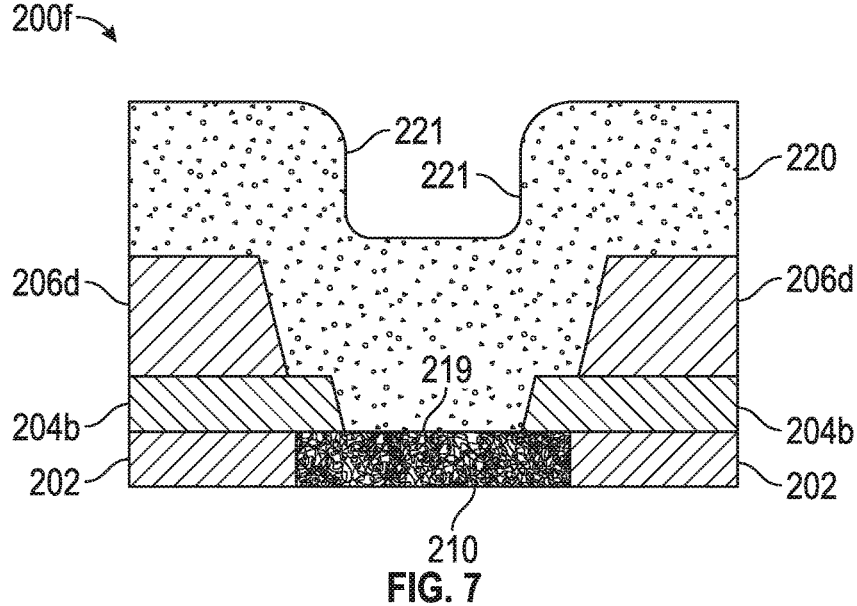

With reference now to FIG. 7, which illustrates integrated circuit structure 200f (a further advanced stage of BEOL fabrication from structure 200e), an aluminum metal layer 220 is formed within stepped via 230 and over the upper dielectric layer 206d. Aluminum layer 220 may be deposited using any conventional conformal deposition process. In contrast to the prior art aluminum layer 120 illustrated in FIG. 1, due to the stepped configuration of stepped via 230, the sidewalls 221 that aluminum layer 220 forms over the via 230 are significantly shallower in angle (i.e., less "overhang") as compared to sidewalls 150. Thus, the method step described with regard to FIG. 7 may be characterized as conformally depositing an aluminum material layer 220 in the stepped via structure 230, in contact with the interconnect wire 210, and over the upper dielectric layer 206d, wherein conformally depositing the aluminum material layer includes forming aluminum layer sidewalls 221 over the stepped via structure 230.

Figure 1:
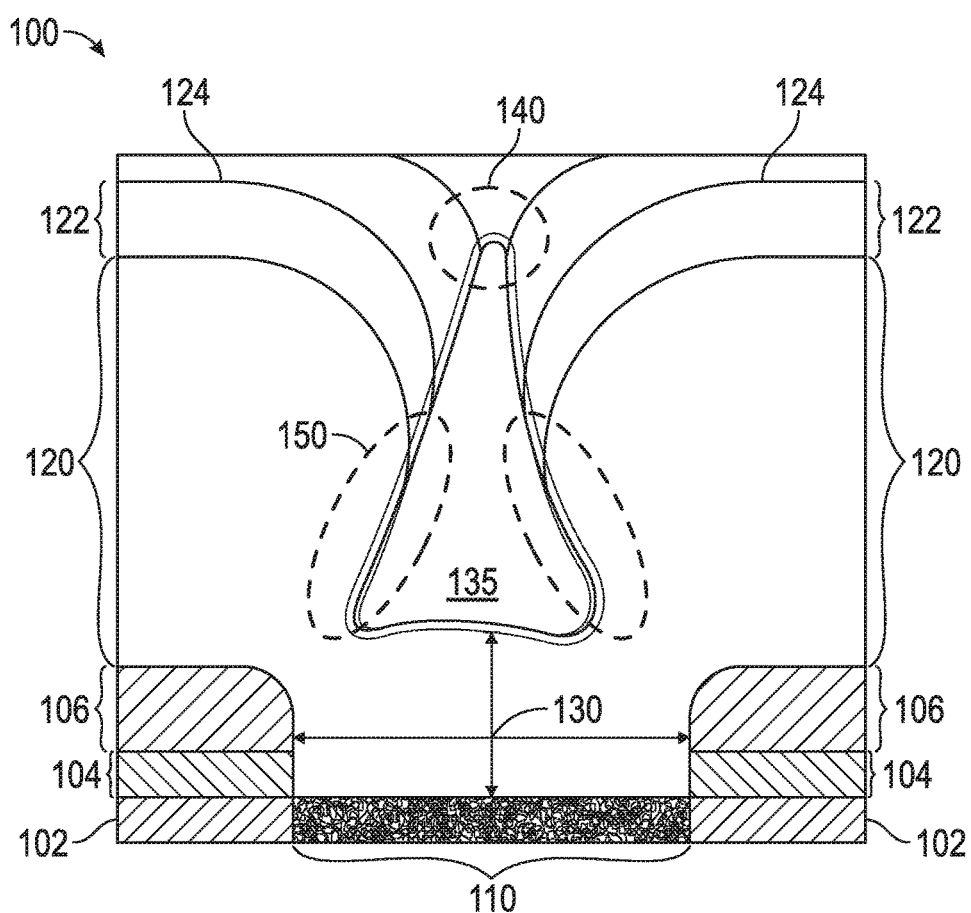
FIG. 1 is a cross-sectional view of an integrated circuit structure including an aluminum via exhibiting problems encountered in the prior art.

Turning now to FIG. 8, which illustrates integrated circuit structure 200g (a further advanced stage of BEOL fabrication from structure 200f), a first passivation layer 222, which may include a silicon dioxide or other suitable low-k material, is deposited conformally over and in contact with the aluminum layer 220, including along its sidewalls 221. Thereafter, as second passivation layer 224, which may include a silicon nitride or other suitable low-k material, is deposited conformally over and in contact with the first passivation layer 222. Thus, the method step described with regard to FIG. 8 may be characterized as forming a passivation layer 222, 224 over the aluminum material layer 220, wherein forming the passivation layer 222, 224 includes forming the passivation layer along the aluminum layer sidewalls 221. Because the angle of the sidewalls 221 are relatively shallow, good passivation coverage is achieved at the sidewalls 221 of the aluminum layer 220 upon deposition of first and second passivation layers 222, 224, thus alleviating the problems of poor passivation encountered in the prior art (e.g., as shown in FIG. 1). That is, the thickness of the passivation layers 222, 224 does not vary significantly along the sidewalls as compared to over other portions (i.e., horizontal surfaces not overlying via structure 230) of the aluminum layer 220.

Figure 9:
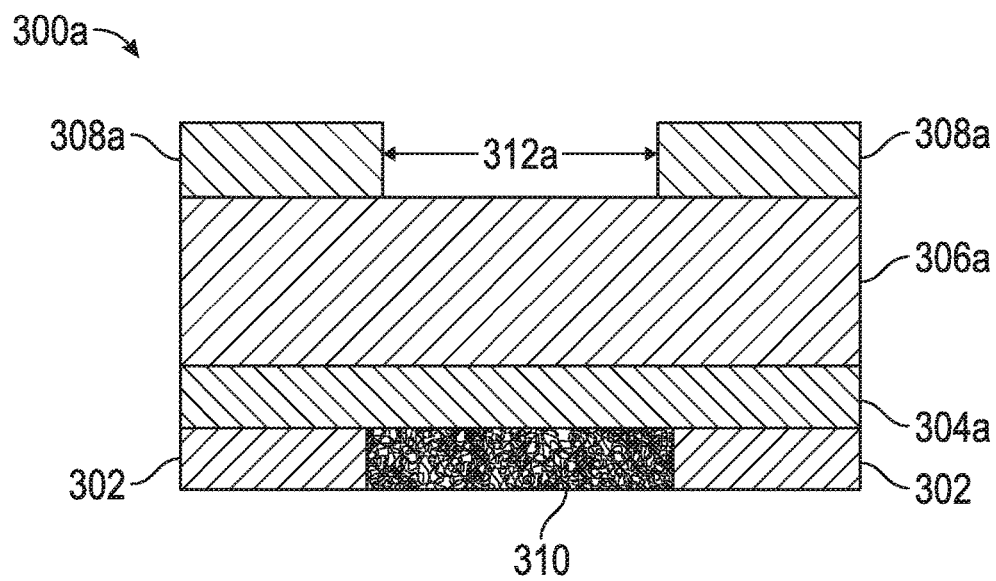
FIGS. 9-15 illustrate, in cross-section, integrated circuit structures and methods for fabricating integrated circuit structures including an aluminum via in accordance with further embodiments of the present disclosure.

FIGS. 9-15 illustrate, in cross-section, integrated circuit structures and methods for fabricating integrated circuit structures including an aluminum via in accordance with further embodiments of the present disclosure. In particular, FIG. 9 illustrates an integrated circuit structure 300a undergoing BEOL processing, similar to the structure 200a shown in FIG. 9, but with the reference numerals incremented by 100. As such, integrated circuit structure 300a illustrates that portion of the integrated circuit located above the microelectronic elements, and including one or more of the interconnect wires, vias, and passivation layers formed during BEOL processing to complete the fabrication of the integrated circuit. In particular, structure 300a includes a first or "interconnect layer" dielectric layer 302. Interconnect layer dielectric layer 302 may be formed of silicon dioxide, silicate glass, or any other suitable low-k dielectric material. Interconnect layer dielectric layer 302 is provided for the purpose of electrically insulating one or more (non-illustrated) underlying interconnection layers or microelectronic element layers, and may be formed using any conventional deposition techniques, such as chemical vapor deposition (CVD), electro-chemical plating (ECP), and the like. Formed within interconnect layer dielectric layer 302 is a metal interconnect wire 310 that provides an electrical connection with one or more other wires or microelectronic elements. Metal interconnect wire may be formed of copper or other conductive metal, and it may be fabricated using conventional damascene or etch-back processes.

Overlying and in contact with interconnect layer dielectric layer 302 and metal interconnection wire 310 is second or lower dielectric layer 304a. Lower dielectric layer 304a may be formed of silicon nitride or any other suitable low-k dielectric material, and it may be provided using any conventional deposition process. Overlying and in contact with lower dielectric layer 304a is a third or upper dielectric layer 306a. Upper dielectric layer 306a may be formed of silicon dioxide, silicate glass, or any other suitable low-k dielectric material, and it may be provided using any convention deposition process.

Further illustrated in FIG. 9 is a patterned photoresist material layer 308a, which is formed over and in contact with upper dielectric layer 306a. Patterned photoresist material layer 308a includes opening 312a. Opening 312a may be formed in photoresist material layer 308a by exposing such layer to a radiation source (such as visible or ultraviolet light) through a patterned mask, and removing the exposed areas, using conventional photolithography processes. Opening 312a may be substantially centered overlying the metal interconnection wire 310. Further, opening 312a and metal interconnection wire 310 may have substantially identical widths across the integrated circuit. Thus, the method step described with regard to FIG. 9 may be characterized as providing or obtaining an integrated circuit structure 300a including a metal interconnect wire 310, a lower dielectric layer 304a disposed over and in contact with the metal interconnect wire 310, and an upper dielectric layer 306a disposed over and in contact with the lower dielectric layer 304a.

Figure 10:
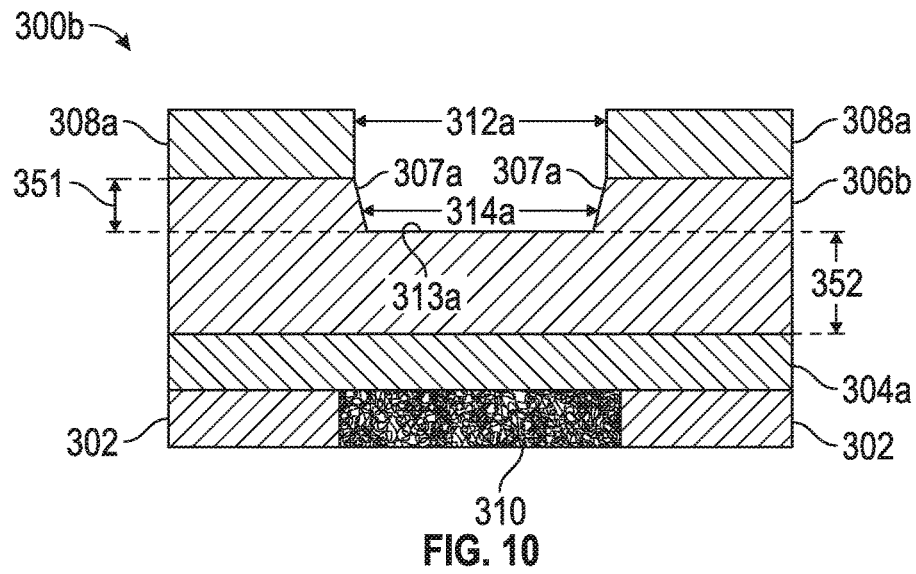

Turning now to FIG. 10, which illustrates integrated circuit structure 300b (a further advanced stage of BEOL fabrication from structure 300a), the patterned photoresist material layer 308a is used as an etch mask to etch the underlying upper dielectric layer 306a. The etched upper dielectric layer, which as a result of etching includes opening 314a, will now be referred to as upper dielectric layer 306b. The etching may be performed on the basis of any suitable wet or dry etching technique, and may be performed in an anisotropic manner such that etching of the upper dielectric layer 306b occurs substantially within the width defined by opening 312a of the patterned photoresist material layer 308a. Opening 314a within the etched upper dielectric layer 306b includes sidewalls 307a and bottom surface 313a. Due to the nature of etching, the sidewalls 307a may be slightly inclined, resulting in a width of bottom surface 313a that is slightly less than the width of opening 312a. It should be understood from FIG. 10 that the anisotropic etching process used to form opening 314a is performed only for a period of time sufficient to etch part-way (less than half way) through the upper dielectric layer 306b. That is, etching is performed such that opening 314a has a vertical depth 351 within upper dielectric layer 306b, and such that bottom surface 313a remains a vertical distance 352 above the lower dielectric layer 304a. The ratio of vertical depth 351 to vertical distance 352 may be from about 1:5 to about 1:1.5, such as about 1:4 to about 1:2. Thus, the method step described with regard to FIG. 10 may be characterized as forming a first opening 314a in the upper dielectric layer 306b, the first opening 314a being substantially centered over the metal interconnect wire 310 and having a width that is substantially identical to a width of the metal interconnect wire 310, wherein the first opening 314a extends to a depth 351 within the upper dielectric layer 306b that is less than half of a total thickness of the upper dielectric layer 306b.

Figure 11:
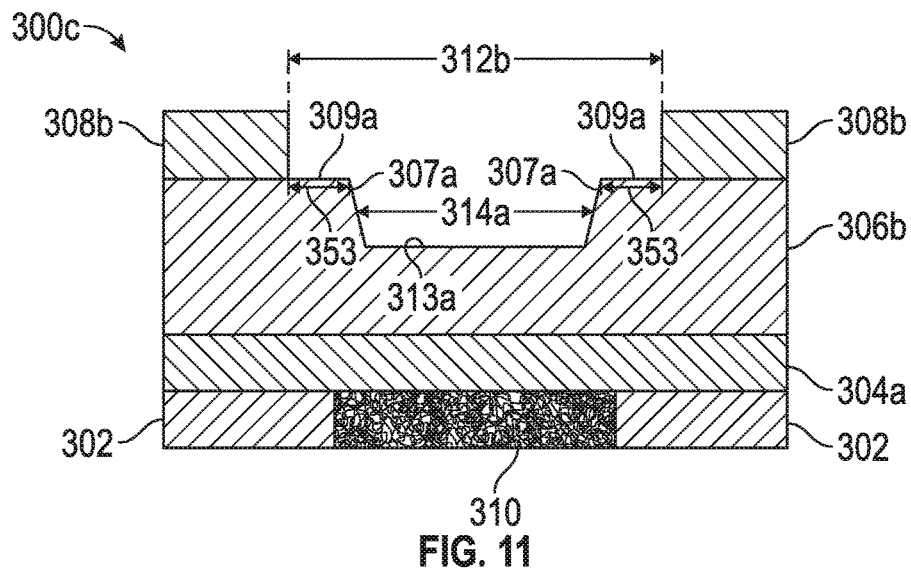

Turning now to FIG. 11, which illustrates integrated circuit structure 300c (a further advanced stage of BEOL fabrication from structure 300b), a resist trimming procedure is employed to widen the opening 312a in the patterned photoresist material layer 308a. Accordingly, the trimmed photoresist material layer will now be referred to as trimmed photoresist material layer 308b. Moreover, the widened opening will now be referred to as opening 312b. Photoresist trimming, as is known in the art, may be accomplished by exposure of the photoresist material to any conventional plasma or etchant that is suitably selective to the photoresist material. Because the photoresist material layer 308b is trimmed, without an etching of the underlying upper dielectric layer 306b, upper surfaces 309a of the upper dielectric layer 306b are exposed. The width 353 of each upper surface 309a is about half of the total increase in width of opening 312b. It should be appreciated that as shown in FIG. 11, opening 314a has not changed in dimensions from FIG. 10.

Figure 12:
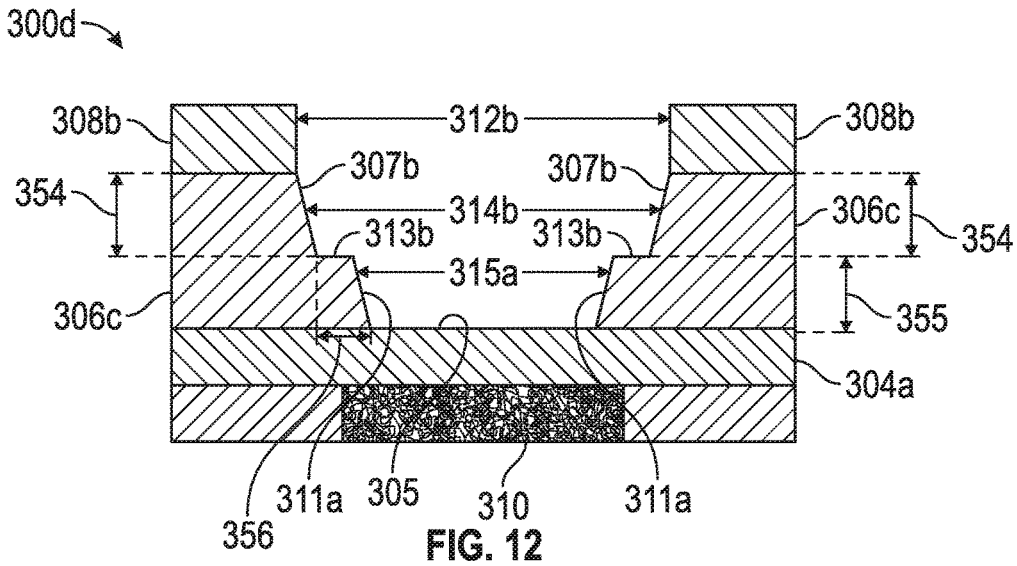

With reference now to FIG. 12, which illustrates integrated circuit structure 300d (a further advanced stage of BEOL fabrication from structure 300c), a further etching procedure is performed to increase the width of opening 314a commensurate in size with opening 312b. The trimmed photoresist material layer 308b is used as an etch mask to etch the underlying upper dielectric layer 306b. The etched upper dielectric layer, which as a result of etching now includes larger opening 314b (having depth 354), will now be referred to as upper dielectric layer 306c. The etching may be performed on the basis of any suitable wet or dry etching technique, and may be performed in an isotropic manner such that etching of the upper dielectric layer 306c occurs to both increase the distance between opening 314b sidewalls (now referred to as sidewalls 307b), but also to etch the bottom surface 313a so as to expose an upper surface 305 of the lower dielectric layer 304a, thereby forming a sub-opening 315a within upper dielectric layer 306c, in the area defined by depth or vertical distance 355, upper surface 305, and sidewalls 311a. Sub-opening 315a may be centered over the interconnect wire 310, and also centered underneath the opening 314b. Sub-opening 315a therefore has a width that is less/narrower (i.e., two times width 356 less) than opening 314b, and a depth 355. In this embodiment, depths 354 and 355 may be substantially identical. Opening 314b within the etched upper dielectric layer 306c includes sidewalls 307b and bottom surfaces 313b. Due to the nature of the etching, the width of bottom surfaces 313b of the opening 314b have a width 356 that is substantially similar to the width 353 of the upper surfaces 309a. Thus, the method step described with regard to FIGS. 11 and 12 may be characterized as forming a sub-opening 315a in the upper dielectric layer 306c, the sub-opening 315a being disposed below the first opening 314b and centered with respect to the first opening 314a, wherein the sub-opening 315a has a width that is narrower than the width of the first opening 314a, and wherein the sub-opening 315a extends through the upper dielectric layer 306c to expose an upper surface 305 of the lower dielectric layer 304a. This method step may also be characterized as disclosing simultaneously with forming the sub-opening 315a, widening the first opening 314a so as to form a widened first opening 314b.

Figure 13:
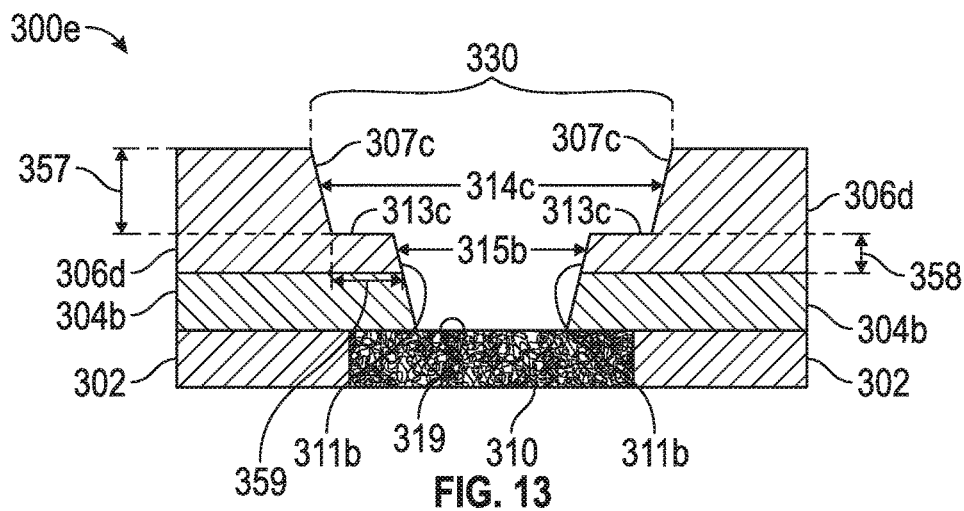

Turning now to FIG. 13, which illustrates integrated circuit structure 300e (a further advanced stage of BEOL fabrication from structure 300d), a further etching procedure is performed to increase the depth of sub-opening 315a into the underlying lower dielectric layer (so as to expose an upper surface 319 of the interconnect wire 310), which will now be referred to as lower dielectric layer 304b. The etching may be performed on the basis of any suitable wet or dry etching technique, and may be performed in an anisotropic manner such that both the depth of the opening 314b (hereafter referred to as opening 314c, and referring to depth 357, which now extends to a distance 358 above the lower dielectric layer 304b (i.e., now greater than half-way through the thickness of upper dielectric layer 306d)) and the sub-opening 315a (hereafter referred to as sub-opening 315b) are increased. In this manner, the bottom surfaces of opening 314c are now formed by surfaces 313c of the upper dielectric layer 306d (located at depth 357), and have a width 359 that is substantially the same as width 356. Sidewalls of the opening 314c are thereby extended in length, and are now referred to as sidewalls 307c; and consequently, the further etched upper dielectric layer is now referred to as upper dielectric layer 306d. Moreover, the bottom surface of the sub-opening 315b is now formed by the interconnect wire 310 (i.e., upper surface 319). As the etching is anisotropic, the width of opening 314c remains substantially unchanged as compared to FIG. 12, and the width of sub-opening 315b remains substantially unchanged as compared to FIG. 12. Photoresist material layer 308b is also fully removed in this etching process. Accordingly, FIG. 13 illustrates a via structure 330 that includes opening 314c and sub-opening 315b. More particularly, via structure 330 is defined by an upper surface 319 of interconnection line 310, sidewalls 311b of the lower dielectric layer 304b and lower thickness 358 of the upper dielectric layer 306d, surfaces 313c of the lower upper layer 306d, and sidewalls 307c of upper dielectric layer 306d. It should also be appreciated that the sidewalls 311b of the lower dielectric layer 304b and lower thickness 358 of the upper dielectric layer 306d and the surfaces 313c of the upper dielectric layer 306d form a "step-like" structure, and thus via structure 330 may be referred to as a stepped via structure. Thus, the method step described with regard to FIG. 13 may be characterized as extending the depth of the widened first opening 314b so as to extend further, but not entirety through the thickness of the upper dielectric layer 306d, thereby forming an extended, widened first opening 314c that is disposed entirely within the upper dielectric layer 306d. The method step may also be characterized as disclosing simultaneously with extending the depth of the widened first opening 314b, extending a depth of the sub-opening 315a so as to extend through an entirety of the lower dielectric layer 304b and expose an upper surface 319 of the interconnect wire 310, thereby forming an extended sub-opening 315b that is disposed partially within the lower dielectric layer 304b and partially within the upper dielectric layer 306d, wherein the extended, widened first opening 314c and the extended sub-opening 315b include the stepped via structure 330.

Figure 14:
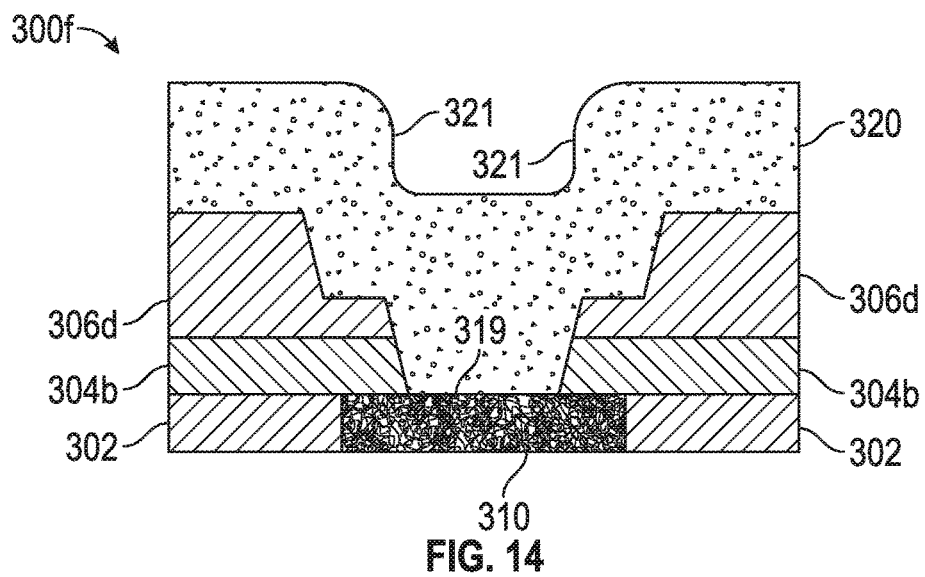

With reference now to FIG. 14, which illustrates integrated circuit structure 300f (a further advanced stage of BEOL fabrication from structure 300e), an aluminum metal layer 320 is formed within stepped via 330 and over the upper dielectric layer 306d. Aluminum layer 320 may be deposited using any conventional conformal deposition process. In contrast to the prior art aluminum layer 120 illustrated in FIG. 1, due to the stepped configuration of stepped via 330, the sidewalls 321 that aluminum layer 320 forms over the via 330 are significantly shallower in angle (i.e., less "overhang") as compared to sidewalls 150. Thus, the method step described with regard to FIG. 14 may be characterized as conformally depositing an aluminum material layer 320 in the stepped via structure 330, in contact with the interconnect wire 310, and over the upper dielectric layer 306d, wherein conformally depositing the aluminum material layer includes forming aluminum layer sidewalls 321 over the stepped via structure 330.

Turning now to FIG. 15, which illustrates integrated circuit structure 300g (a further advanced stage of BEOL fabrication from structure 300f, a first passivation layer 322, which may include a silicon dioxide or other suitable low-k material, is deposited conformally over and in contact with the aluminum layer 320, including along its sidewalls 321. Thereafter, as second passivation layer 324, which may include a silicon nitride or other suitable low-k material, is deposited conformally over and in contact with the first passivation layer 322. Thus, the method step described with regard to FIG. 15 may be characterized as forming a passivation layer 322, 324 over the aluminum material layer 320, wherein forming the passivation layer 322, 324 includes forming the passivation layer along the aluminum layer sidewalls 321. Because the angle of the sidewalls 321 are relatively shallow, good passivation coverage is achieved at the sidewalls 321 of the aluminum layer 320 upon deposition of first and second passivation layers 322, 324, thus alleviating the problems of poor passivation encountered in the prior art (e.g., as shown in FIG. 1). That is, the thickness of the passivation layers 322, 324 does not vary significantly along the sidewalls as compared to over other portions (i.e., horizontal surfaces not overlying via structure 330) of the aluminum layer 320.

Thus, with regard to any of the embodiments described above, the subject matter of the present disclosure may be understood as providing a method for fabricating an integrated circuit that includes a) forming a first opening (214c/314c) in an upper dielectric layer (206d/306d), the first opening (214c/314c) having a first width, b) forming a second opening (216/315b) in a lower dielectric layer (204b/304b), the lower dielectric layer being below the upper dielectric layer (206d/306d), the second opening (216/315b) having a second width that is narrower than the first width, the second opening being substantially centered underneath the first opening so as to form a stepped via structure (230/330), c) conformally depositing an aluminum material layer (220/320) in the stepped via structure (230/330) and over the upper dielectric layer (206d/306d), and d) forming a passivation layer (222, 224, 322, 324) over the aluminum material layer (220/320). The first opening (214c) may be formed entirely within the upper dielectric layer (206d) and the second opening (216) may be formed entirely within the lower dielectric layer (204b). Alternatively, the first opening (314c) may be formed entirely within the upper dielectric layer (306d) and the second opening (315b) may be formed partially within the lower dielectric layer (304b) and partially within the upper dielectric layer (206b). Depositing the aluminum material layer may include forming aluminum layer sidewalls (221/321) over the stepped via structure (230/330), and forming the passivation layer (222, 224, 322, 324) may include forming the passivation layer along the aluminum layer sidewalls (221/321). Further, forming the second opening (216/315b) may include exposing a metal interconnect wire (210/210), and conformally depositing the aluminum material layer (220/320) may include forming aluminum material in contact with the metal interconnect wire (210/310).

Accordingly, the above-described embodiments provide integrated circuits and methods for fabricating integrated circuits that achieve improved resistance to environmental harms, as well as better control of electrical properties. Moreover, these integrated circuits and methods for fabricating integrated circuits avoid the problem of inadequate passivation of aluminum layers formed over vias. Additionally, the described methods for the fabrication of such integrated circuits are easily integrated into existing process flow schemes used in semiconductor fabrication facilities, as there is no need for unconventional tooling, equipment, or materials (i.e., all the processes described above can be performed using conventional tooling, equipment, and materials).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the subject matter in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A method for fabricating an integrated circuit that includes a stepped via structure comprising:
   providing or obtaining an integrated circuit structure comprising a metal interconnect wire, a lower dielectric layer disposed over and in contact with the metal interconnect wire, and an upper dielectric layer disposed over and in contact with the lower dielectric layer;
   forming a first opening in the upper dielectric layer, the first opening being substantially centered over the metal interconnect wire and having a width that is substantially identical to a width of the metal interconnect wire, wherein the first opening extends to a depth within the upper dielectric layer that is less than a total thickness of the upper dielectric layer, but greater than half of the total thickness of the upper dielectric layer;
   forming a sub-opening in the upper dielectric layer, the sub-opening being disposed below the first opening and centered with respect to the first opening, wherein the sub-opening has a width that is narrower than the width of the first opening, and wherein the sub-opening extends through the upper dielectric layer to expose an upper surface of the lower dielectric layer; simultaneously with forming the sub-opening, widening the first opening so as to form a widened first opening;
   extending the depth of the widened first opening so as to extend through an entirety of the thickness of the upper dielectric layer, thereby forming an extended, widened first opening that is disposed entirely within the upper dielectric layer;
   simultaneously with extending the depth of the widened first opening, extending a depth of the sub-opening so as to extend through an entirety of the lower dielectric layer and expose an upper surface of the interconnect wire, thereby forming an extended sub-opening that is disposed entirely within the lower dielectric layer, wherein the extended, widened first opening and the extended sub-opening comprise the stepped via structure;
   conformally depositing an aluminum material layer in the stepped via structure, in contact with the interconnect wire, and over the upper dielectric layer, wherein conformally depositing the aluminum material layer comprises forming aluminum layer sidewalls over the stepped via structure; and
   forming a passivation layer over the aluminum material layer, wherein forming the passivation layer comprises forming the passivation layer along the aluminum layer sidewalls.

2. The method of claim 1, wherein providing or obtaining the integrated circuit structure comprises providing or obtaining an integrated circuit structure comprising a copper interconnect wire.

3. The method of claim 1, wherein providing or obtaining the integrated circuit structure comprises providing or obtaining an integrated circuit structure comprising a silicon nitride lower dielectric layer.

4. The method of claim 1, wherein providing or obtaining the integrated circuit structure comprises providing or obtaining an integrated circuit structure comprising a silicon dioxide upper dielectric layer.

5. The method of claim 1, wherein forming the passivation layer comprises forming a passivation layer comprising silicon dioxide in a first layer over the aluminum material layer.

6. The method of claim 5, wherein forming the passivation layer comprises forming a passivation layer comprising silicon nitride in a second layer over the first layer.

7. The method of claim 1, wherein providing or obtaining the integrated circuit structure comprises providing or obtaining an integrated circuit structure comprising an interconnect wire wherein the interconnect wire is formed over a semiconductor substrate, the semiconductor substrate comprising a plurality of active integrated circuit devices.

8. A method for fabricating an integrated circuit that includes a stepped via structure comprising:
   providing or obtaining an integrated circuit structure comprising a metal interconnect wire, a lower dielectric layer disposed over and in contact with the metal interconnect wire, and an upper dielectric layer disposed over and in contact with the lower dielectric layer;
   forming a first opening in the upper dielectric layer, the first opening being substantially centered over the metal interconnect wire and having a width that is substantially identical to a width of the metal interconnect wire, wherein the first opening extends to a depth within the upper dielectric layer that is less than half of a total thickness of the upper dielectric layer;

forming a sub-opening in the upper dielectric layer, the sub-opening being disposed below the first opening and centered with respect to the first opening, wherein the sub-opening has a width that is narrower than the width of the first opening, and wherein the sub-opening extends through the upper dielectric layer to expose an upper surface of the lower dielectric layer;

simultaneously with forming the sub-opening, widening the first opening so as to form a widened first opening;

extending the depth of the widened first opening so as to extend further, but not entirety through the thickness of the upper dielectric layer, thereby forming an extended, widened first opening that is disposed entirely within the upper dielectric layer;

simultaneously with extending the depth of the widened first opening, extending a depth of the sub-opening so as to extend through an entirety of the lower dielectric layer and expose an upper surface of the interconnect wire, thereby forming an extended sub-opening that is disposed partially within the lower dielectric layer and partially within the upper dielectric layer, wherein the extended, widened first opening and the extended sub-opening comprise the stepped via structure;

conformally depositing an aluminum material layer in the stepped via structure, in contact with the interconnect wire, and over the upper dielectric layer, wherein conformally depositing the aluminum material layer comprises forming aluminum layer sidewalls over the stepped via structure; and forming a passivation layer over the aluminum material layer, wherein forming the passivation layer comprises forming the passivation layer along the aluminum layer sidewalls.

9. The method of claim 8, wherein providing or obtaining the integrated circuit structure comprises providing or obtaining an integrated circuit structure comprising a copper interconnect wire.

10. The method of claim 8, wherein providing or obtaining the integrated circuit structure comprises providing or obtaining an integrated circuit structure comprising a silicon nitride lower dielectric layer.

11. The method of claim 8, wherein providing or obtaining the integrated circuit structure comprises providing or obtaining an integrated circuit structure comprising a silicon dioxide upper dielectric layer.

12. The method of claim 8, wherein forming the passivation layer comprises forming a passivation layer comprising silicon dioxide in a first layer over the aluminum material layer.

13. The method of claim 12, wherein forming the passivation layer comprises forming a passivation layer comprising silicon nitride in a second layer over the first layer.

14. The method of claim 8, wherein providing or obtaining the integrated circuit structure comprises providing or obtaining an integrated circuit structure comprising an interconnect wire wherein the interconnect wire is formed over a semiconductor substrate, the semiconductor substrate comprising a plurality of active integrated circuit devices.

* * * * *